(12) United States Patent
Chou et al.

(10) Patent No.: US 9,679,994 B1
(45) Date of Patent: Jun. 13, 2017

(54) HIGH FIN CUT FABRICATION PROCESS

(71) Applicant: Taiwan Semiconductor Manufacturing Company Limited, Hsinchu (TW)

(72) Inventors: L. C. Chou, Taipei (TW); Chih-Liang Chen, Hsinchu (TW); Chih-Ming Lai, Hsinchu (TW); Charles Chew-Yuen Young, Cupertino, CA (US); Chin-Yuan Tseng, Hsinchu (TW); Jiann-Tyng Tzeng, Hsinchu (TW); Kam-Tou Sio, Hsinchu County (TW); Ru-Gun Liu, Hsinchu County (TW); Wei-Liang Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/251,639

(22) Filed: Aug. 30, 2016

(51) Int. Cl.
  *H01L 21/336* (2006.01)
  *H01L 29/66* (2006.01)
  *H01L 21/306* (2006.01)
  *H01L 21/308* (2006.01)
  *H01L 21/762* (2006.01)

(52) U.S. Cl.
  CPC .... *H01L 29/66795* (2013.01); *H01L 21/3085* (2013.01); *H01L 21/30604* (2013.01); *H01L 21/76224* (2013.01); *H01L 29/6656* (2013.01); *H01L 29/66545* (2013.01)

(58) Field of Classification Search
  CPC .................................................. H01L 21/336
  See application file for complete search history.

(56) References Cited

U.S. PATENT DOCUMENTS 9,324,570 B1 * 4/2016 Liou ................... H01L 21/0337
9,455,346 B2 * 9/2016 Wu ...................... H01L 29/7848

* cited by examiner

Primary Examiner — Marvin Payen
(74) Attorney, Agent, or Firm — Jones Day

(57) ABSTRACT

A method of forming fins on a substrate is provided. The method comprises depositing first fin spacers comprising first fin spacer material and second fin spacers comprising second fin spacer material on a plurality of locations on a substrate having a hard mask above the substrate's semiconductor material, wherein the first fin spacers comprise desired first fin spacers and dummy first fin spacers and the second fin spacers comprise desired second fin spacers and dummy second fin spacers. The method further comprises forming fins on the substrate under the first fin spacers and the second fin spacers. The fins comprise a plurality of dummy fins and a plurality of desired fins. The dummy fins comprise a plurality of dummy first fins formed under the dummy first fin spacers and a plurality of dummy second fins formed under the dummy second fin spacers. The method further comprises removing the dummy first fin spacers separately from removing the dummy second fin spacers, removing the dummy second fin spacers, and removing the dummy fins without damaging the desired fins.

20 Claims, 17 Drawing Sheets

HIGH FIN CUT FABRICATION PROCESS

BACKGROUND

The technology described in this patent document relates generally to semiconductor devices and more particularly to fabricating fins for a FinFet semiconductor structure.

Improvements to FinFet technology has enabled continued improvement in speed, performance, density, and cost per unit function of integrated circuits. Development of improved fabrication techniques can further improve integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
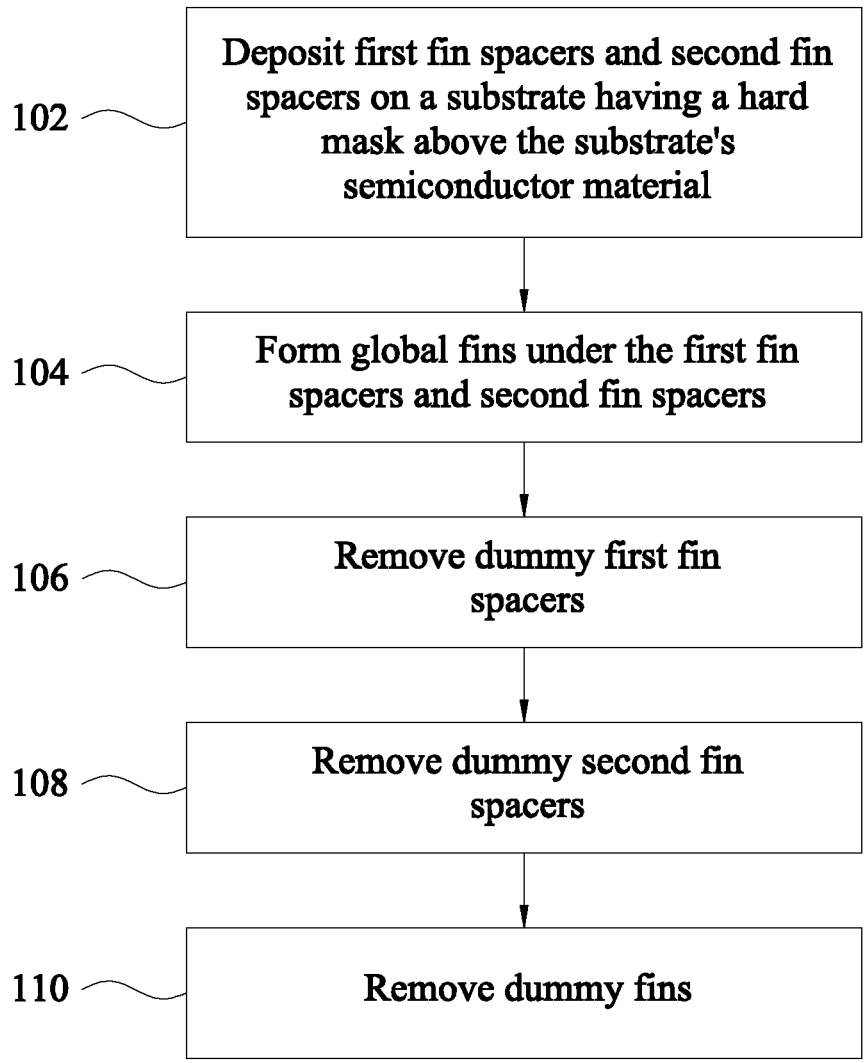
FIG. 1 is a process flow chart illustrating an example method of forming fins for a semiconductor device on a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a process flow chart illustrating an example method of forming fins for a semiconductor device on a substrate. A plurality of first fin spacers comprising first fin spacer material and second fin spacers comprising second fin spacer material is deposited on a plurality of locations on a substrate having a hard mask (used to protect the substrate) above the substrate's semiconductor material (operation 102). The first fin spacers include desired first fin spacers and dummy first fin spacers. The second fin spacers include desired second fin spacers and dummy second fin spacers. A plurality of fins is then formed on the substrate under the first fin spacers and the second fin spacers (operation 104). The fins comprise a plurality of dummy fins and a plurality of desired fins. The dummy fins include a plurality of dummy first fins formed under the dummy first fin spacers and a plurality of dummy second fins formed under the dummy second fin spacers. Next, the dummy first fin spacers are removed while the dummy second fin spacers remain (operation 106). Then, the dummy second fin spacers are removed (operation 108). The dummy fins are removed without damaging the desired fins (operation 110).

Figure 2:
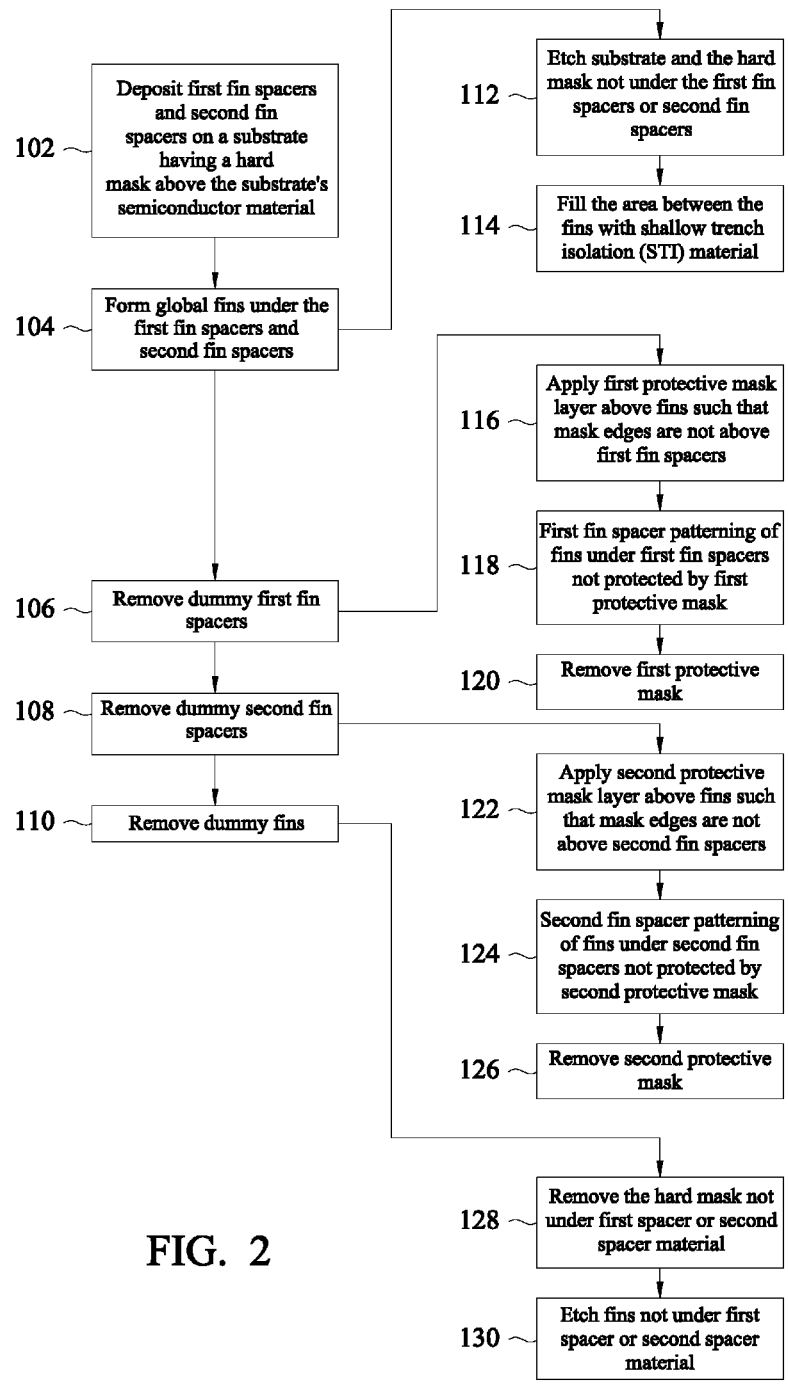
FIG. 2 is a process flow chart illustrating another example method of forming fins for a semiconductor device on a substrate, in accordance with some embodiments.

FIG. 2 is a process flow chart illustrating another example method of forming fins for a semiconductor device on a substrate. Operations 102-110 are similar to operations specified in FIG. 1.

In the example method of FIG. 2, forming fins on the substrate under the first fin spacers and the second fin spacers (operation 104) includes removing the substrate and hard mask not under the first fin spacers or second fin spacers using etching operations to form the fins (operation 112); and filling the area between the formed fins with shallow trench isolation (STI) material (operation 114).

In the example method of FIG. 2, removing the dummy first fin spacers (operation 106) includes applying a first protective mask layer above the desired first fin spacers and the second fin spacers, wherein second fin spacers are closer to edges of the first protective mask layer than any of the desired first fin spacers (operation 116). Because the edges of the first protective mask layer is not above any of the desired first fin spacers, the likelihood of defects during the dummy fin removal process is decreased. The first fin spacer material is then removed from the dummy first fins using patterning operations (operation 118). The first protective mask layer is removed (operation 120).

In the example method of FIG. 2, removing the dummy second fin spacers (operation 108) includes applying a second protective mask layer above the desired first fin spacers and the desired second fin spacers, wherein desired first fin spacers are closer to edges of the second protective mask layer than any of the desired second fin spacers (operation 122); removing the second fin spacer material from the dummy second fins using patterning operations (operation 124); and removing the second protective mask layer (operation 126).

In the example method of FIG. 2, removing the dummy fins without damaging the desired fins (operation 110) includes removing the hard mask over the dummy fins (operation 128) and removing the dummy fins using etching operations (operation 130).

Figure 3:
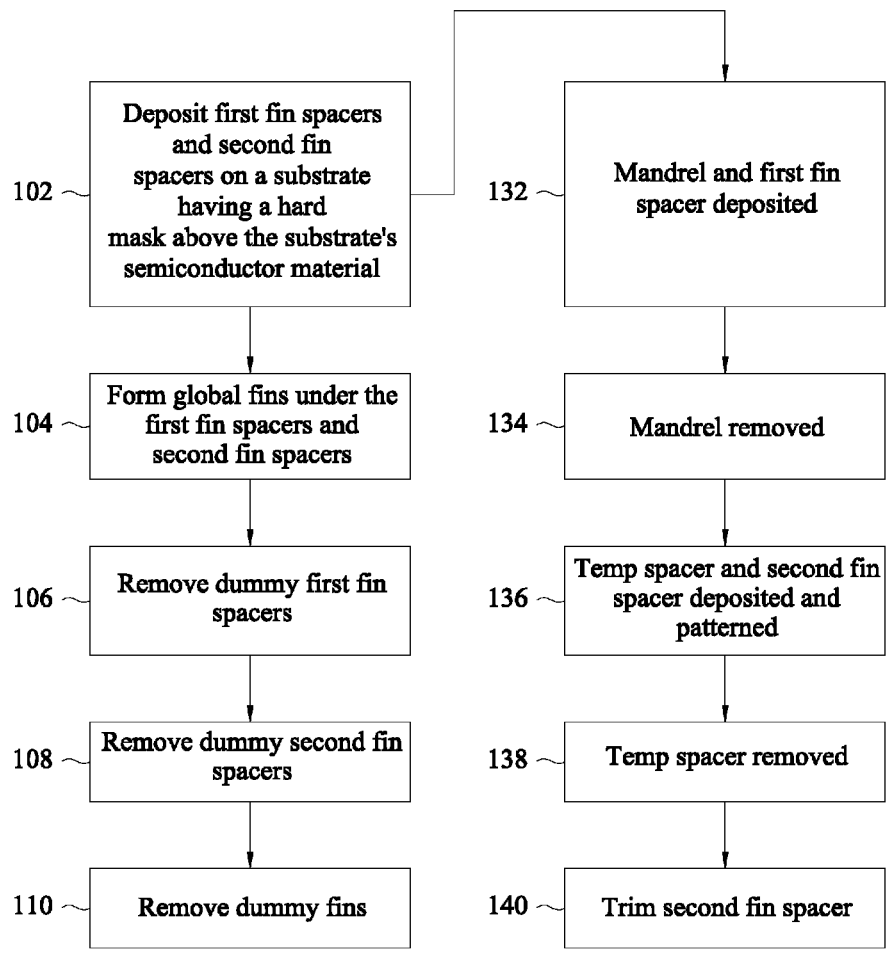
FIG. 3 is a process flow chart illustrating another example method of forming fins for a semiconductor device on a substrate, in accordance with some embodiments.

FIG. 3 is a process flow chart illustrating another example method of forming fins for a semiconductor device on a substrate. Operations 102-110 are similar to operations specified in FIG. 1.

In the example method of FIG. 3, depositing first fin spacers and second fin spacers on a substrate having a hard mask above the substrate's semiconductor material (operation 102) includes depositing a mandrel and first fin spacers on the hard mask (operation 132); removing the mandrel after the first fin spacers have been deposited (operation 134); and depositing temporary spacers and second fin spacers on the hard mask and forming the temporary spacers and the second fin spacers into a desired shape using patterning operations (operation 136). The method further includes removing the temporary spacers (operation 138) and trimming the second fin spacers (operation 140).

Figure 4:
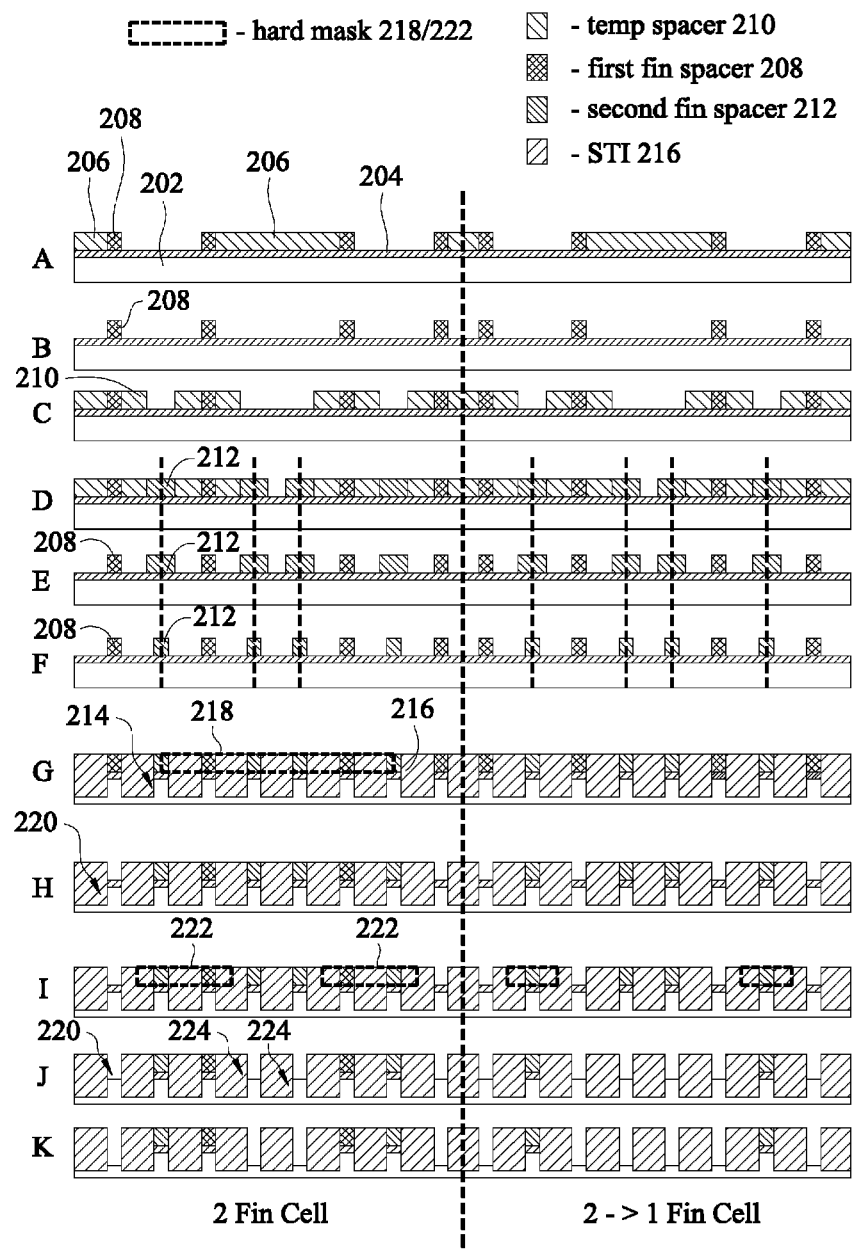
FIG. 4 contains a series of block diagrams, in rows A through K, of an example semiconductor structure, wherein each row illustrates the example semiconductor structure at a different stage in an example fin fabrication process, in accordance with some embodiments.

FIG. 4 contains a series of block diagrams, in rows A through K, of an example semiconductor structure, wherein each row illustrates the example semiconductor structure at a different stage in an example fin fabrication process such as one performed in accordance with the operations specified in FIGS. 1, 2 and 3. In particular, rows A through F illustrate the depositing of first fin spacers and second fin spacers on a substrate having a hard mask above the substrate's semiconductor material, row G illustrates the forming of global fins under the first and second fin spacers, and rows H through K illustrate the strategic use of the first and second fin spacer material and hard masks in the selective removal of dummy or undesired fins to achieve the fins per transistor ratio desired for different cells on the substrate. The first fin spacers and second fin spacers are strategically placed to allow for the dummy or undesired fins to be selectively removed from the cells while decreasing the risk that desired fins will suffer from fin defects during the fin removal process. In this example, the first and second fin spacers are strategically placed to allow for the simultaneous fabrication of 2 fin cells and 1 fin cells.

Row A illustrates an example fabrication stage resulting after performance of operation 132 of FIG. 3 and depicts a substrate 202 with a hard mask (used to protect the substrate) 204 above the substrate and mandrels 206 and first fin spacers 208 deposited above the hard mask. Row B illustrates an example fabrication stage resulting after performance of operation 134 of FIG. 3 and depicts the semiconductor structure after the mandrels have been removed leaving first fin spacers 208. Row C illustrates an example fabrication stage after temporary spacers 210 have been deposited. Row D illustrates an example fabrication stage resulting after performance of operation 136 of FIG. 3 and depicts second fin spacers 212 deposited and patterned. Row E illustrates an example fabrication stage resulting after performance of operation 138 of FIG. 3 and depicts that the temporary spacers 210 have been removed. Row F illustrates an example fabrication stage resulting after performance of operation 140 of FIG. 3 (and operation 102 of FIGS. 1-3) and depicts that the second fin spacers 212 have been trimmed to a desired size.

Row G illustrates an example fabrication stage resulting after performance of operation 104 of FIGS. 1-3 (and operations 112 and 114 of FIG. 2) and depicts that global fins 214 have been formed under the first fin spacers 208 and second fin spacers 212, the area between the fins have been filled with shallow trench isolation (STI) material 216, and a first hard mask layer 218 has been applied above some of the fins 214.

Row H illustrates an example fabrication stage resulting after performance of operation 106 of FIGS. 1-3 (and operations 116, 118 and 120 of FIG. 2) and depicts that the first fin spacer material has been removed above selective fins 220 (e.g., dummy first fins) not protected by the first hard mask layer 218 and that the first hard mask layer has been removed. Row I illustrates an example fabrication stage resulting after performance of operation 122 of FIG. 2 and depicts that a second protective mask layer 222 has been applied above select fins exposing non desired (i.e., dummy) fins. Row J illustrates an example fabrication stage resulting after performance of operation 108 of FIGS. 1-3 (and operations 122, 124, and 126 of FIG. 2) and depicts that the second fin spacer material has been removed above selective fins 224 (e.g., dummy second fins) not protected by the second hard mask layer 218, that the second hard mask layer 222 has been removed, and the hard mask has been removed above all dummy fins. Row K illustrates an example fabrication stage resulting after performance of operation 110 of FIGS. 1-3 (and operations 128 and 130 of FIG. 2) and depicts that the dummy first and second fins 220, 224 have been removed. This example illustrates the simultaneous fabrication of fins in 2 cells but can be applied to the simultaneous fabrication of much more than 2 cells. Also, this example illustrates the simultaneous fabrication of cells having 2 fins per transistor and cells having 1 fin per transistor.

By using different spacer material in the first fin spacers and the second fin spacers, hard masks and patterning operations can be selectively applied to minimize fin defects during the fin removal process. In this example, the edges of the first hard mask layer border second fin spacers so that when patterning operations are performed on the first fin spacers, the desired first fin spacers are adequately protected by the first hard mask layer. Similarly, the edges of the second hard mask layer border first fin spacers so that when patterning operations are performed on the second fin spacers, the desired second fin spacers are adequately protected by the second hard mask layer.

Figure 5:
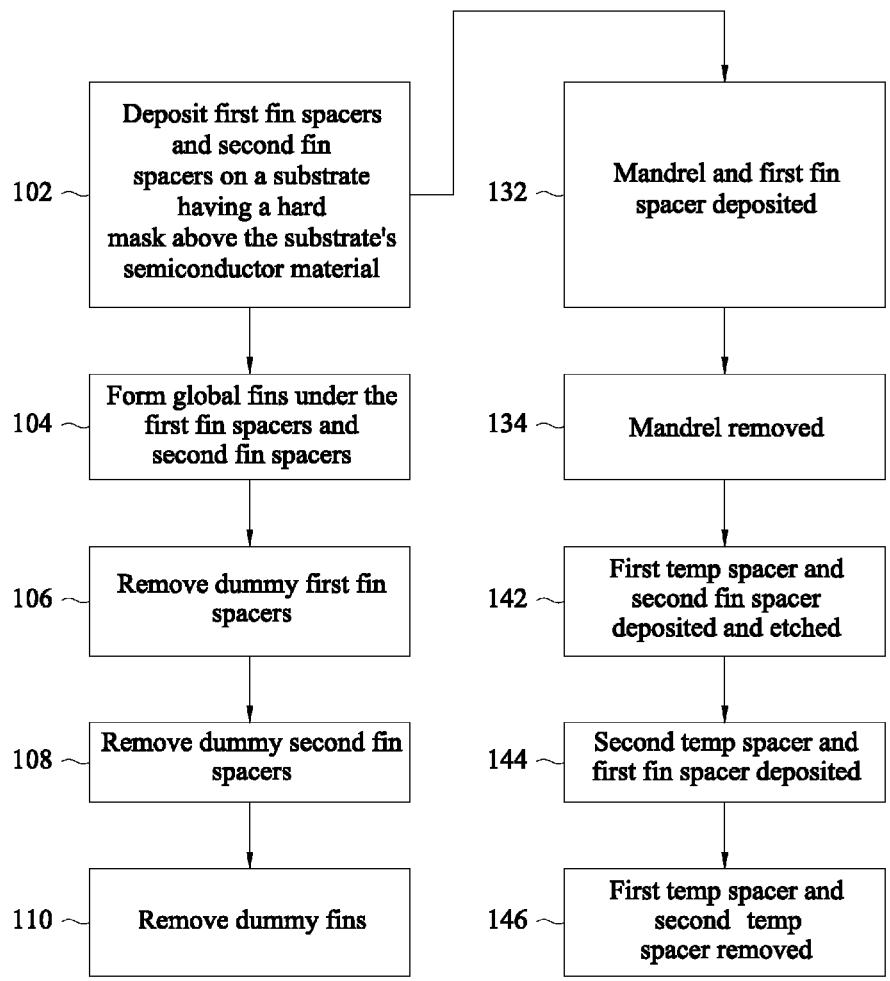
FIG. 5 is a process flow chart illustrating another example method of forming fins for a semiconductor device on a substrate, in accordance with some embodiments.

FIG. 5 is a process flow chart illustrating another example method of forming fins for a semiconductor device on a substrate. Operations 102-110 are similar to operations 102-110 specified in FIG. 1. In this example, depositing first fin spacers and second fin spacers on a substrate having a hard mask above the substrate's semiconductor material (operation 102) includes depositing a mandrel and first fin spacers on the hard mask (operation 132), and removing the mandrel after the first fin spacers have been deposited (operation 134). This example operation further includes depositing first temporary spacers and second fin spacers on the hard mask and using etching operations to form the first temporary spacers and the second fin spacers into a desired shape (operation 142); depositing second temporary spacers and additional first fin spacers (operation 144); and removing the first temporary spacers and the second temporary spacers (operation 146) leaving first fin spacers and second fin spacers.

Figure 6:
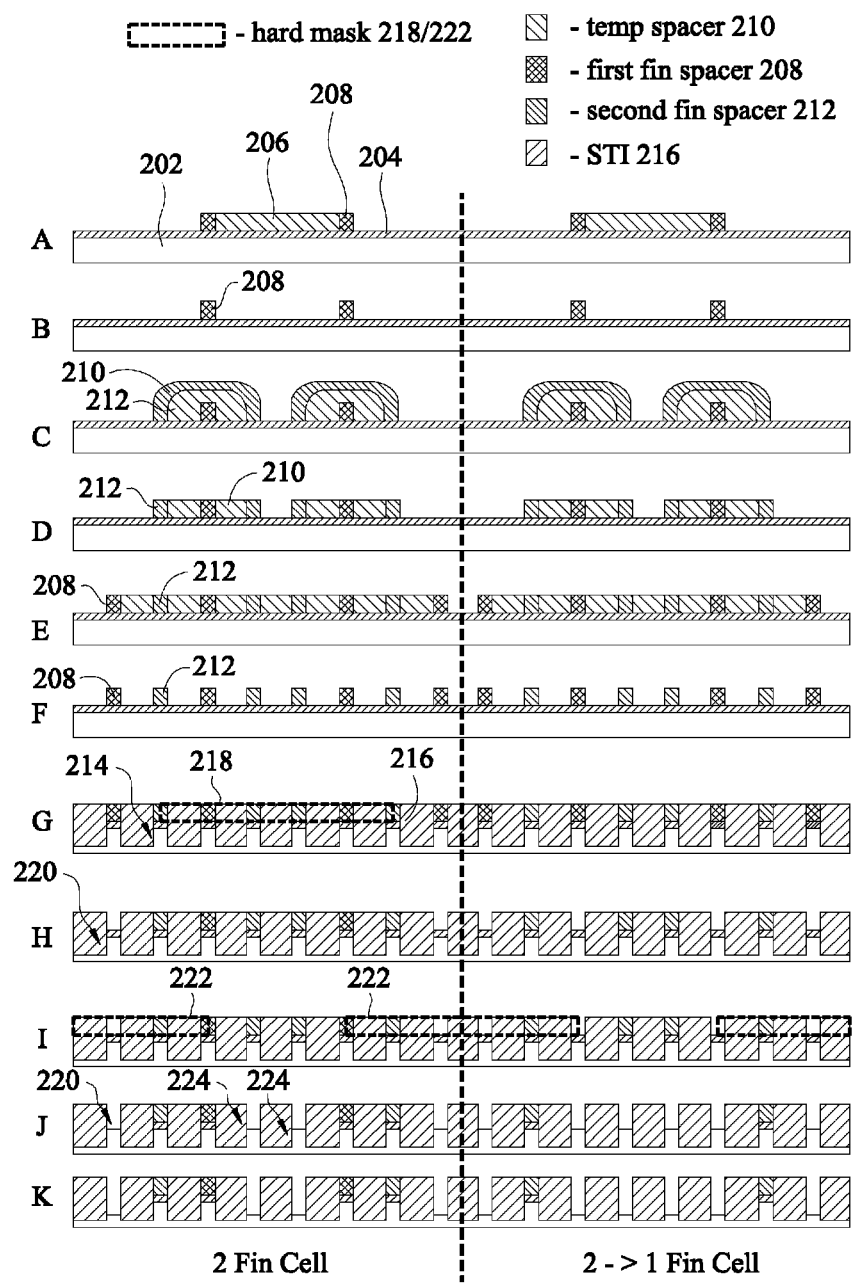
FIG. 6 contains a series of block diagrams, in rows A through K, of another example semiconductor structure, wherein each row illustrates the example semiconductor structure at a different stage in an example fin fabrication process, in accordance with some embodiments.

FIG. 6 contains a series of block diagrams, in rows A through K, of another example semiconductor structure, wherein each row illustrates the example semiconductor structure at a different stage in an example fin fabrication process such as one performed in accordance with the operations specified in FIGS. 1, 2, and 5. In particular, rows A through F illustrate the depositing of first fin spacers and second fin spacers on a substrate having a hard mask above the substrate's semiconductor material, row G illustrates the forming of global fins under the first and second fin spacers, and rows H through K illustrate the strategic use of the first and second fin spacer material and hard masks in the selective removal of dummy or undesired fins to achieve the fins per transistor ratio desired for different cells on the substrate. The first fin spacers and second fin spacers are strategically placed to allow for the dummy or undesired fins to be selectively removed from the cells while decreasing the risk that desired fins will suffer from fin defects during the fin removal process. In this example, the first fin spacers and second fin spacers are strategically placed to allow for the simultaneous fabrication of 2 fin cells and 1 fin cells.

Row A illustrates an example fabrication stage resulting after performance of operation 132 of FIG. 5 and depicts a substrate 202 with a hard mask (used to protect the substrate) 204 above the substrate and mandrels 206 and first fin spacers 208 deposited above the hard mask. Row B illustrates an example fabrication stage resulting after performance of operation 134 of FIG. 5 and depicts the semiconductor structure after the mandrels have been removed leaving first fin spacers 208. Row C illustrates an example fabrication stage after first temporary spacers 310 have been deposited and then second fin spacers 212 have been deposited. Row D illustrates an example fabrication stage resulting after performance of operation 142 of FIG. 5 and depicts that first temporary spacers 310 and second fin spacers 212 have been deposited and etched. Row E illustrates an example fabrication stage resulting after performance of operation 144 of FIG. 5 and depicts that second temporary spacers 312 and additional first fin spacers 208 have been deposited. Row F illustrates an example fabrication stage resulting after performance of operation 146 of FIG. 5 (and operation 102 of FIGS. 1, 2 and 5) and depicts that first temporary spacers 310 and second temporary spacers 312 have been removed leaving selectively places first and second fin spacers 208, 212.

After the first and second fin spacers have been selectively placed, the fin formation can be accomplished using the techniques described above with regard to FIGS. 1 and 2 and rows G-K of FIG. 4. Rows G-K of FIG. 6 correspond to rows G-K of FIG. 4 and the description above regarding rows G-K of FIG. 4 are incorporated here by reference as if describing rows G-K of FIG. 6.

Figure 7:
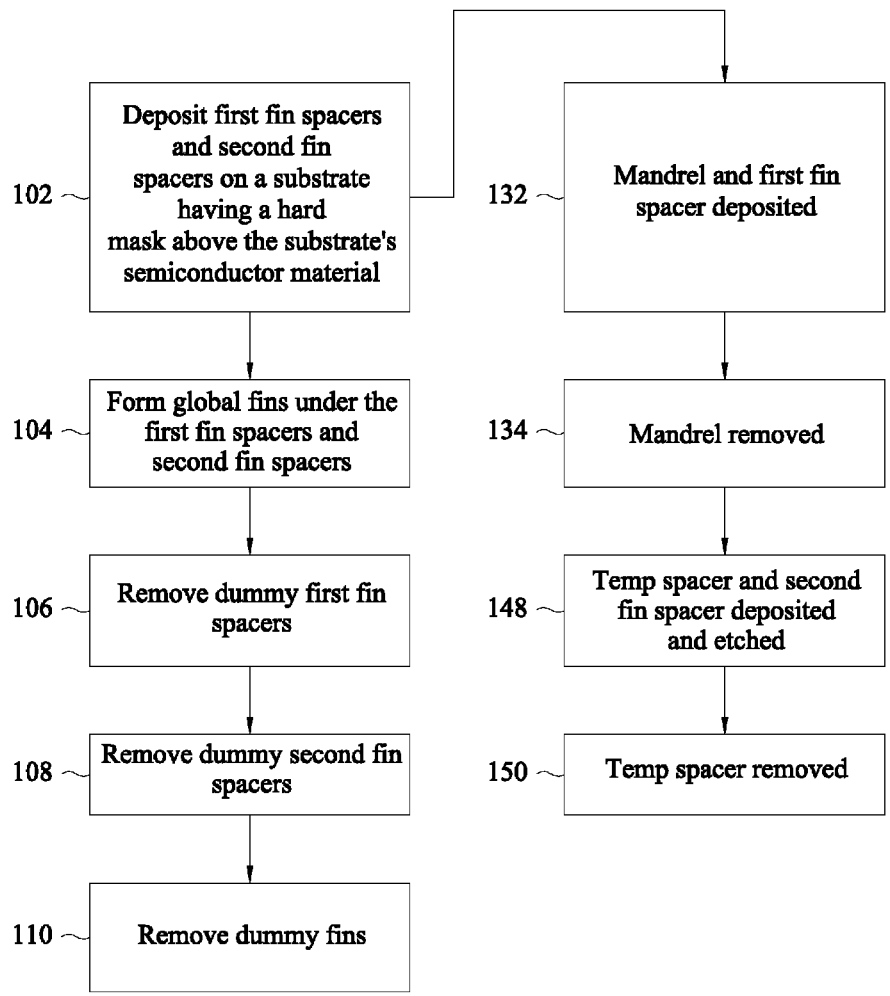
FIG. 7 is a process flow chart illustrating another example method of forming fins for a semiconductor device on a substrate, in accordance with some embodiments.

FIG. 7 is a process flow chart illustrating another example method of forming fins for a semiconductor device on a substrate. Operations 102-110 are similar to operations specified in FIG. 1. In this example, depositing first fin spacers and second fin spacers on a substrate having a hard mask above the substrate's semiconductor material (operation 102) includes depositing a mandrel and first fin spacers on the hard mask (operation 132), removing the mandrel after the first fin spacers have been deposited (operation 134), depositing temporary spacers and second fin spacers on the hard mask and forming the temporary spacers and second fin spacers into a desired shape using etching operations (operation 148), and removing the temporary spacers (operation 150).

Figure 8:
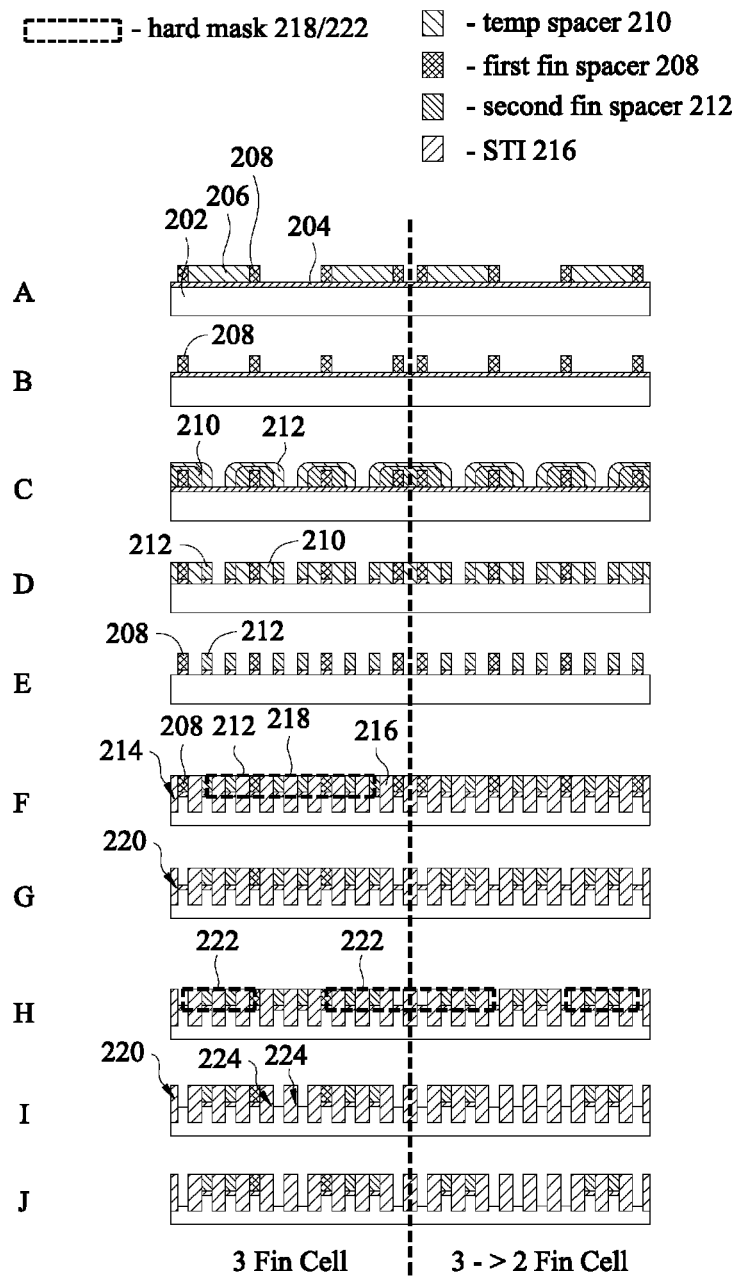
FIG. 8, contains a series of block diagrams, in rows A through J, of another example semiconductor structure, wherein each row illustrates the example semiconductor structure at a different stage in an example fin fabrication process, in accordance with some embodiments.

FIG. 8, contains a series of block diagrams, in rows A through J, of another example semiconductor structure, wherein each row illustrates the example semiconductor structure at a different stage in an example fin fabrication process such as one performed in accordance with the operations specified in FIGS. 1, 2 and 7. In particular, rows A through E illustrate the depositing of first fin spacers and second fin spacers on a substrate having a hard mask above the substrate's semiconductor material, row F illustrates the forming of global fins under the first and second fin spacers, and rows G through J illustrate the strategic use of the first and second fin spacer material and hard masks in the selective removal of dummy or undesired fins to achieve the fins per transistor ratio desired for different cells on the substrate. The first fin spacers and second fin spacers are strategically placed to allow for the dummy or undesired fins to be selectively removed from the cells while decreasing the risk that desired fins will suffer from fin defects during the fin removal process. In this example, the first fin spacers and second fin spacers are strategically placed to allow for the simultaneous fabrication of 3 fin cells and 2 fin cells.

Row A illustrates an example fabrication stage resulting after performance of operation 132 of FIG. 7 and depicts a substrate 202 with a hard mask (used to protect the substrate) 204 above the substrate and mandrels 206 and first fin spacers 208 deposited above the hard mask. Row B illustrates an example fabrication stage resulting after performance of operation 134 of FIG. 7 and depicts the semiconductor structure after the mandrels have been removed leaving first fin spacers 208. Row C illustrates an example fabrication stage after temporary spacers 210 have been deposited and then second fin spacers 212 have been deposited. Row D illustrates an example fabrication stage resulting after performance of operation 148 of FIG. 7 and depicts that temporary spacers 210 and second fin spacers 212 have been deposited and etched. Row E illustrates an example fabrication stage resulting after performance of operation 150 of FIG. 7 and depicts that temporary spacers 210 have been removed leaving selectively places first and second fin spacers 208, 212.

After the first and second fin spacers have been selectively placed, the fin formation can be accomplished using the techniques described with regard to FIGS. 1 and 2 and rows F-J of FIG. 8. Row F illustrates an example fabrication stage resulting after performance of operation 104 of FIGS. 1, 2 and 7 (and operations 112 and 114 of FIG. 2) and depicts that global fins 214 have been formed under the first fin spacers 208 and second fin spacers 212, the area between the fins have been filled with shallow trench isolation 216, and a first hard mask layer 218 has been applied above some of the fins 214.

Row G illustrates an example fabrication stage resulting after performance of operation 106 of FIGS. 1, 2 and 7 (and operations 116, 118 and 120 of FIG. 2) and depicts that the first fin spacer material has been removed above selective fins 220 (e.g., dummy first fins) not protected by the first hard mask layer 218 and that the first hard mask layer has been removed. Row H illustrates an example fabrication stage resulting after performance of operation 122 of FIG. 2 and depicts that a second protective mask layer 222 has been applied above select fins exposing non desired (i.e., dummy) fins. Row I illustrates an example fabrication stage resulting after performance of operation 108 of FIGS. 1, 2 and 7 (and operations 122, 124, and 126 of FIG. 2) and depicts that the second fin spacer material has been removed above selective fins 224 (e.g., dummy second fins) not protected by the second hard mask layer 218, that the second hard mask layer 222 has been removed, and the hard mask has been removed above all dummy fins. Row J illustrates an example fabrication stage resulting after performance of operation 110 of FIGS. 1, 2 and 7 (and operations 128 and 130 of FIG. 2) and depicts that the dummy first and second fins 220, 224 have been removed. This example illustrates the simultaneous fabrication of fins in 2 cells but can be applied to the simultaneous fabrication of much more than 2 cells. Also, this example illustrates the simultaneous fabrication of 3 fin cells and 2 fin cells.

By using different spacer material in the first fin spacers and the second fin spacers, hard masks and patterning operations can be selectively applied to minimize fin defects during the fin removal process. In this example, the edges of the first hard mask layer border second fin spacers so that when patterning operations are performed on the first fin spacers, the desired first fin spacers are adequately protected by the first hard mask layer. Similarly, the edges of the second hard mask layer border first fin spacers so that when patterning operations are performed on the second fin spacers, the desired second fin spacers are adequately protected by the second hard mask layer.

Figure 9:
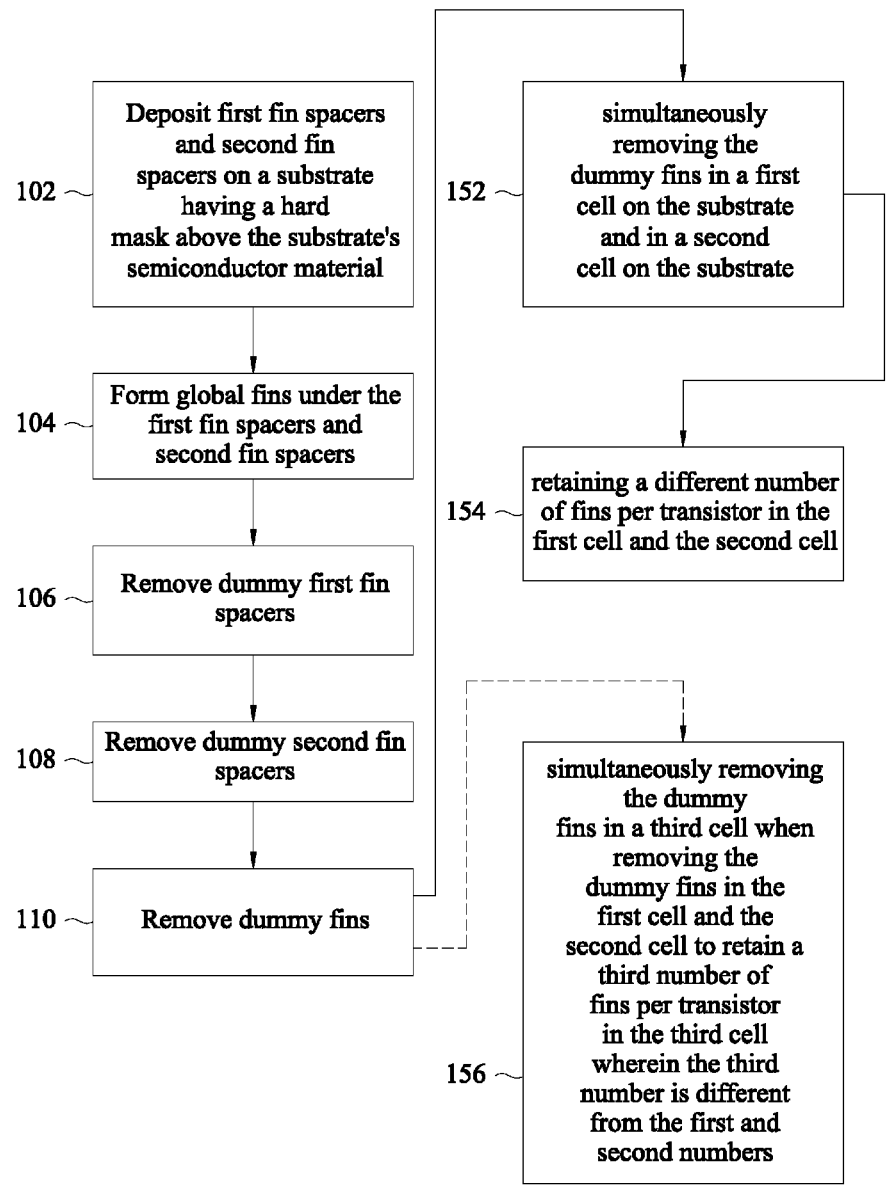
FIG. 9 is a process flow chart illustrating another example method of forming fins for a semiconductor device on a substrate, in accordance with some embodiments.

FIG. 9 is a process flow chart illustrating another example method of forming fins for a semiconductor device on a substrate. Operations 102-110 are similar to operations specified in FIG. 1. In this example, removing the dummy fins without damaging the desired fins (operation 110) includes simultaneously removing the dummy fins in a first cell on the substrate and in a second cell on the substrate (operation 152). Also in this example, simultaneously removing the dummy fins in a first cell and in a second cell includes retaining a first number of fins per transistor in the first cell and retaining a second number of fins per transistor in the second cell, wherein the first number and the second number are different (operation 154). This example optionally includes simultaneously removing the dummy fins in a third cell when removing the dummy fins in the first cell and the second cell to retain a third number of fins per transistor in the third cell wherein the third number is different from the first and second numbers.

Figure 10:
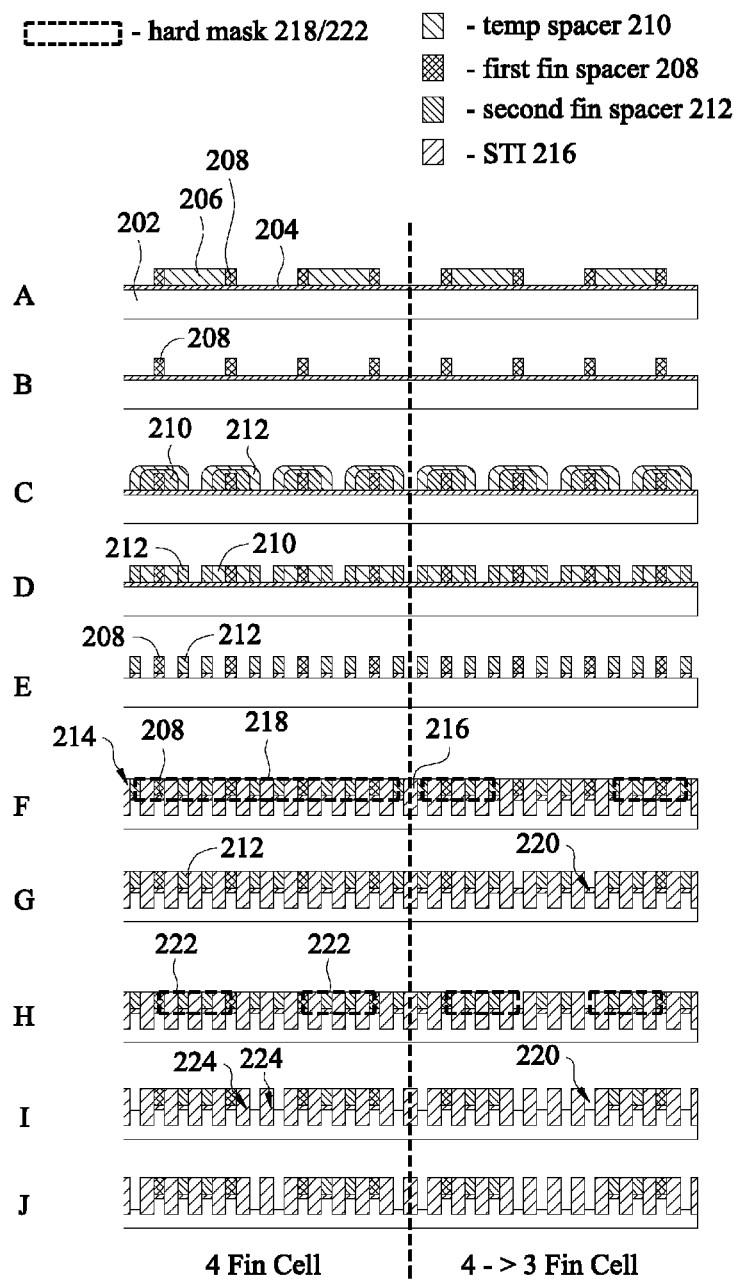
FIGS. 10 and 11 each contain a series of block diagrams, in rows A through J, of additional example semiconductor structures, wherein each row illustrates the example semiconductor structures at a different stage in an example fin fabrication process, in accordance with some embodiments.
Figure 11:
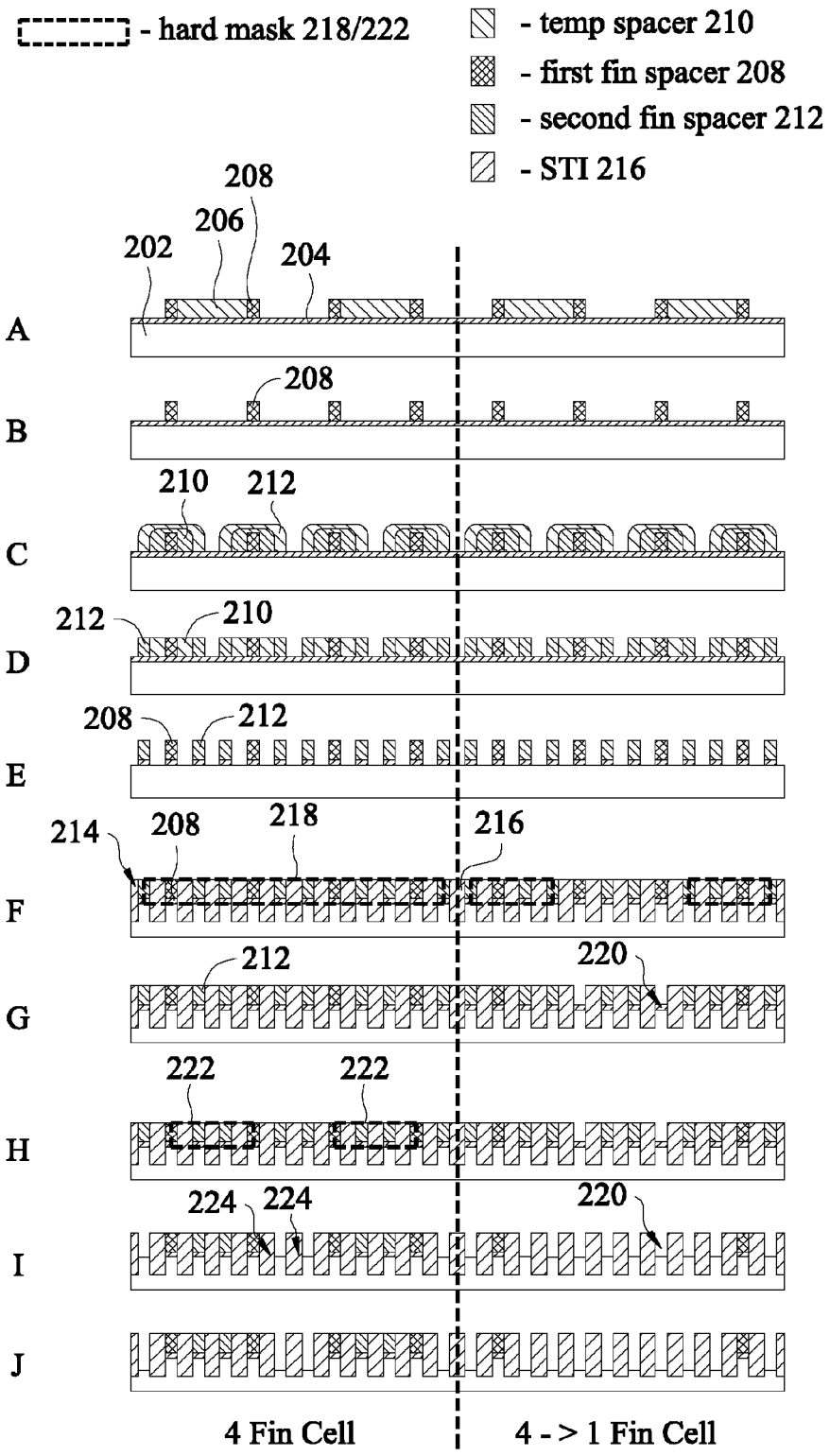

FIGS. 10 and 11 each contain a series of block diagrams, in rows A through J, of additional example semiconductor structures, wherein each row illustrates the example semiconductor structures at a different stage in an example fin fabrication process such as one performed in accordance with the operations specified in FIGS. 1, 2 and 7, and 9. In particular, rows A through E illustrate the depositing of first fin spacers and second fin spacers on a substrate having a hard mask above the substrate's semiconductor material, row F illustrates the forming of global fins under the first and second fin spacers, and rows G through J illustrate the strategic use of the first and second fin spacer material and hard masks in the selective removal of dummy or undesired fins to achieve the fins per transistor ratio desired for different cells on the substrate. The first fin spacers and second fin spacers are strategically placed to allow for the dummy or undesired fins to be selectively removed from the cells while decreasing the risk that desired fins will suffer from fin defects during the fin removal process. In these examples, the first fin spacers and second fin spacers are strategically placed to allow for the simultaneous fabrication of 4 fin cells (FIGS. 10 and 11), 3 fin cells (FIG. 10), and 1 fin cells (FIG. 11).

Row A illustrates an example fabrication stage resulting after performance of operation 132 of FIG. 7 and depicts a substrate 202 with a hard mask (used to protect the substrate) 204 above the substrate and mandrels 206 and first fin spacers 208 deposited above the hard mask. Row B illustrates an example fabrication stage resulting after performance of operation 134 of FIG. 7 and depicts the semiconductor structure after the mandrels have been removed leaving first fin spacers 208. Row C illustrates an example fabrication stage after temporary spacers 210 have been deposited and then second fin spacers 212 have been deposited. Row D illustrates an example fabrication stage resulting after performance of operation 148 of FIG. 7 and depicts that temporary spacers 210 and second fin spacers 212 have been deposited and etched. Row E illustrates an example fabrication stage resulting after performance of operation 150 of FIG. 7 and depicts that temporary spacers 210 have been removed leaving selectively places first and second fin spacers 208, 212.

After the first and second fin spacers have been selectively placed, the fin formation can be accomplished using the techniques described with regard to FIGS. 1 and 2 and rows F-J of FIGS. 10 and 11. Row F illustrates an example fabrication stage resulting after performance of operation 104 of FIGS. 1, 2, 7 and 9 (and operations 112 and 114 of FIG. 2) and depicts that global fins 214 have been formed under the first fin spacers 208 and second fin spacers 212, the area between the fins have been filled with shallow trench isolation 216, and a first hard mask layer 218 has been applied above some of the fins 214. Row G illustrates an example fabrication stage resulting after performance of operation 106 of FIGS. 1, 2, 7 and 9 (and operations 116, 118 and 120 of FIG. 2) and depicts that the first fin spacer material has been removed above selective fins 220 (e.g., dummy first fins) not protected by the first hard mask layer 218 and that the first hard mask layer has been removed. Row H illustrates an example fabrication stage resulting after performance of operation 122 of FIG. 2 and depicts that a second protective mask layer 222 has been applied above select fins exposing non desired (i.e., dummy) fins. Row I illustrates an example fabrication stage resulting after performance of operation 108 of FIGS. 1, 2, 7 and 9 (and operations 122, 124, and 126 of FIG. 2) and depicts that the second fin spacer material has been removed above selective fins 224 (e.g., dummy second fins) not protected by the second hard mask layer 218, that the second hard mask layer 222 has been removed, and the hard mask has been removed above all dummy fins. Row J illustrates an example fabrication stage resulting after performance of operation 110 of FIGS. 1, 2, 7 and 9 (and operations 128 and 130 of FIG. 2) and depicts that the dummy first and second fins 220, 224 have been removed.

These examples illustrate the simultaneous fabrication of fins in 2 cells but can be applied to the simultaneous fabrication of much more than 2 cells. Also, these examples illustrate that 4 fin cells, 3 fin cells, and 1 fin cells may be fabricated simultaneously in a semiconductor device using the example operations described above. By the selective application of the second hard mask layer 218, 4 fin cells (as illustrated in FIGS. 10 and 11), 3 fin cells (as illustrated in FIG. 10), and 1 fin cells (as illustrated in FIG. 11) may be formed simultaneously.

Figure 12:
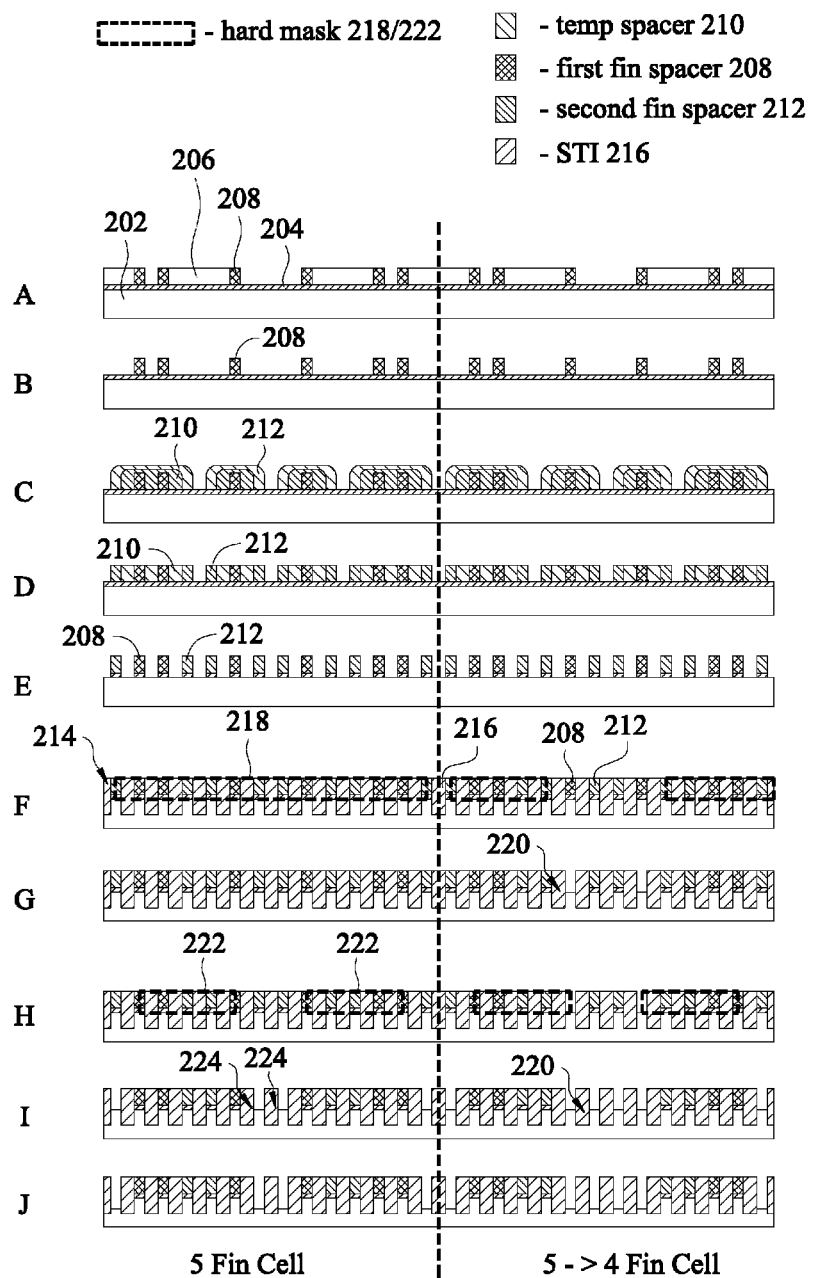
FIGS. 12 and 13 each contain a series of block diagrams, in rows A through J, of additional example semiconductor structures, wherein each row illustrates the example semiconductor structures at a different stage in an example fin fabrication process, in accordance with some embodiments.
Figure 13:
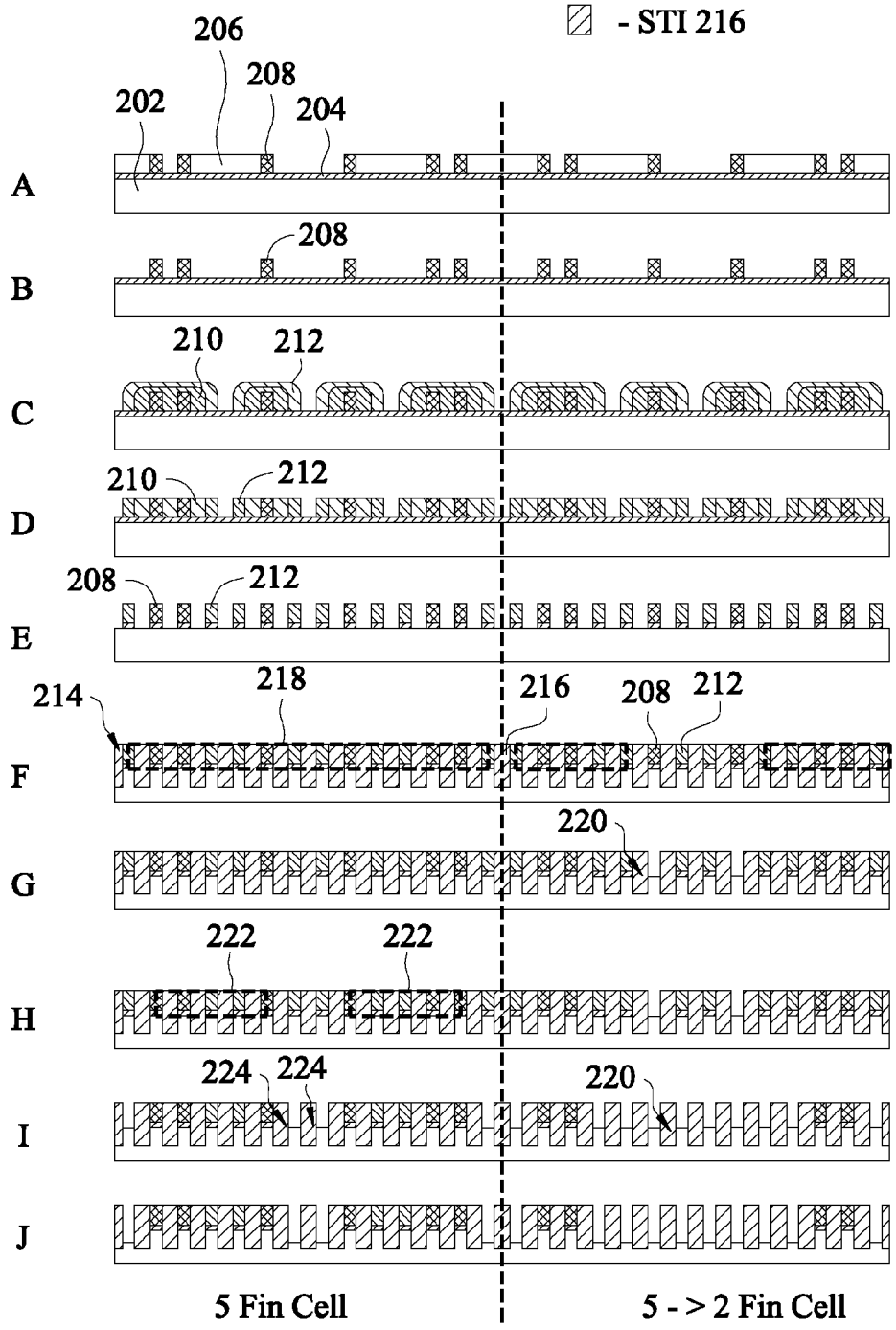

FIGS. 12 and 13 each contain a series of block diagrams, in rows A through J, of additional example semiconductor structures, wherein each row illustrates the example semiconductor structures at a different stage in an example fin fabrication process such as one performed in accordance with the operations specified in FIGS. 1, 2 and 7, and 9. In particular, rows A through E illustrate the depositing of first fin spacers and second fin spacers on a substrate having a hard mask above the substrate's semiconductor material, row F illustrates the forming of global fins under the first and second fin spacers, and rows G through J illustrate the strategic use of the first and second fin spacer material and hard masks in the selective removal of dummy or undesired fins to achieve the fins per transistor ratio desired for different cells on the substrate. The first fin spacers and second fin spacers are strategically placed to allow for the dummy or undesired fins to be selectively removed from the cells while decreasing the risk that desired fins will suffer from fin defects during the fin removal process. In these examples, the first fin spacers and second fin spacers are strategically placed to allow for the simultaneous fabrication of 5 fin cells (FIGS. 12 and 13), 4 fin cells (FIG. 12), and 2 fin cells (FIG. 13).

Row A illustrates an example fabrication stage resulting after performance of operation 132 of FIG. 7 and depicts a substrate 202 with a hard mask (used to protect the substrate) 204 above the substrate and mandrels 206 and first fin spacers 208 deposited above the hard mask. Row B illustrates an example fabrication stage resulting after performance of operation 134 of FIG. 7 and depicts the semiconductor structure after the mandrels have been removed leaving first fin spacers 208. Row C illustrates an example fabrication stage after temporary spacers 210 have been deposited and then second fin spacers 212 have been deposited. Row D illustrates an example fabrication stage resulting after performance of operation 148 of FIG. 7 and depicts that temporary spacers 210 and second fin spacers 212 have been deposited and etched. Row E illustrates an example fabrication stage resulting after performance of operation 150 of FIG. 7 and depicts that temporary spacers 210 have been removed leaving selectively places first and second fin spacers 208, 212.

After the first and second fin spacers have been selectively placed, the fin formation can be accomplished using the techniques described with regard to FIGS. 1 and 2 and rows F-J of FIGS. 12 and 13. Row F illustrates an example fabrication stage resulting after performance of operation 104 of FIGS. 1, 2, 7 and 9 (and operations 112 and 114 of FIG. 2) and depicts that global fins 214 have been formed under the first fin spacers 208 and second fin spacers 212, the area between the fins have been filled with shallow trench isolation 216, and a first hard mask layer 218 has been applied above some of the fins 214. Row G illustrates an example fabrication stage resulting after performance of operation 106 of FIGS. 1, 2, 7 and 9 (and operations 116, 118 and 120 of FIG. 2) and depicts that the first fin spacer material has been removed above selective fins 220 (e.g., dummy first fins) not protected by the first hard mask layer 218 and that the first hard mask layer has been removed. Row H illustrates an example fabrication stage resulting after performance of operation 122 of FIG. 2 and depicts that a second protective mask layer 222 has been applied above select fins exposing non desired (i.e., dummy) fins. Row I illustrates an example fabrication stage resulting after performance of operation 108 of FIGS. 1, 2, 7 and 9 (and operations 122, 124, and 126 of FIG. 2) and depicts that the second fin spacer material has been removed above selective fins 224 (e.g., dummy second fins) not protected by the second hard mask layer 218, that the second hard mask layer 222 has been removed, and the hard mask has been removed above all dummy fins. Row J illustrates an example fabrication stage resulting after performance of operation 110 of FIGS. 1, 2, 7 and 9 (and operations 128 and 130 of FIG. 2) and depicts that the dummy first and second fins 220, 224 have been removed.

These examples illustrate the simultaneous fabrication of fins in 2 cells but can be applied to the simultaneous fabrication of much more than 2 cells. Also, these examples illustrate that 5 fin cells, 4 fin cells, and 2 fin cells may be fabricated simultaneously in a semiconductor device using the example operations described above. By the selective application of the second hard mask layer 218, 5 fin cells (as illustrated in FIGS. 12 and 13), 4 fin cells (as illustrated in FIG. 12), and 2 fin cells (as illustrated in FIG. 13) may be formed simultaneously.

Figure 14:
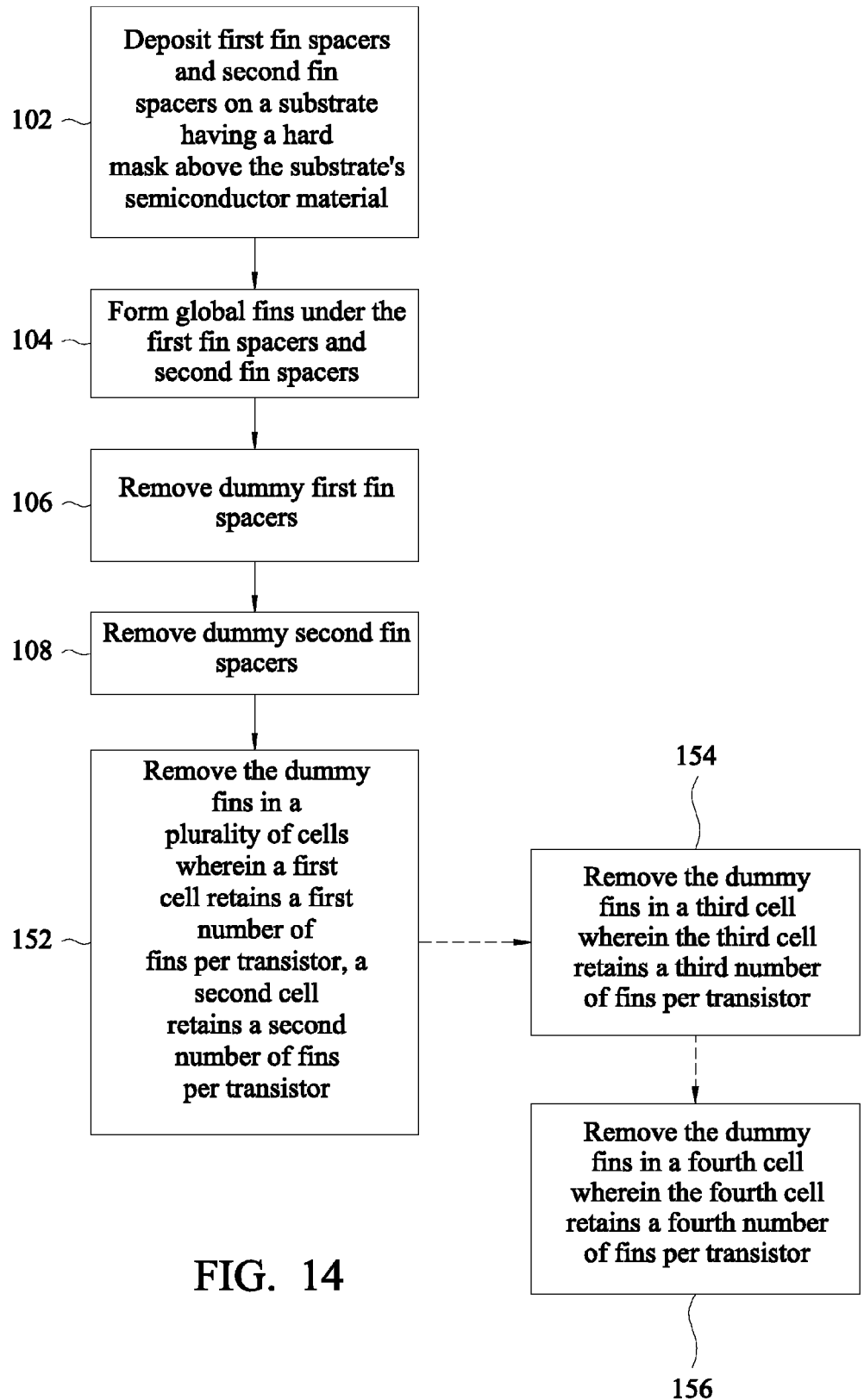
FIG. 14 is a process flow chart illustrating another example method of forming fins for a semiconductor device on a substrate, in accordance with some embodiments.

FIG. 14 is a process flow chart illustrating another example method of forming fins for a semiconductor device on a substrate. Operations 102-108 are similar to operations specified in FIG. 1. This example also includes removing the dummy fins in a plurality of cells wherein a first cell retains a first number of fins per transistor and a second cell retains a second number of fins per transistor (operation 152). This example optionally includes simultaneously removing the dummy fins in a third cell when removing the dummy fins in the first cell and the second cell to retain a third number of fins per transistor in the third cell wherein the third number is different from the first and second numbers (operation 154). This example further optionally includes simultaneously removing the dummy fins in a fourth cell when removing the dummy fins in the first cell, second cell, and third cell to retain a fourth number of fins per transistor in the fourth cell wherein the fourth number is different from the first, second and third numbers (operation 156).

Figure 15:
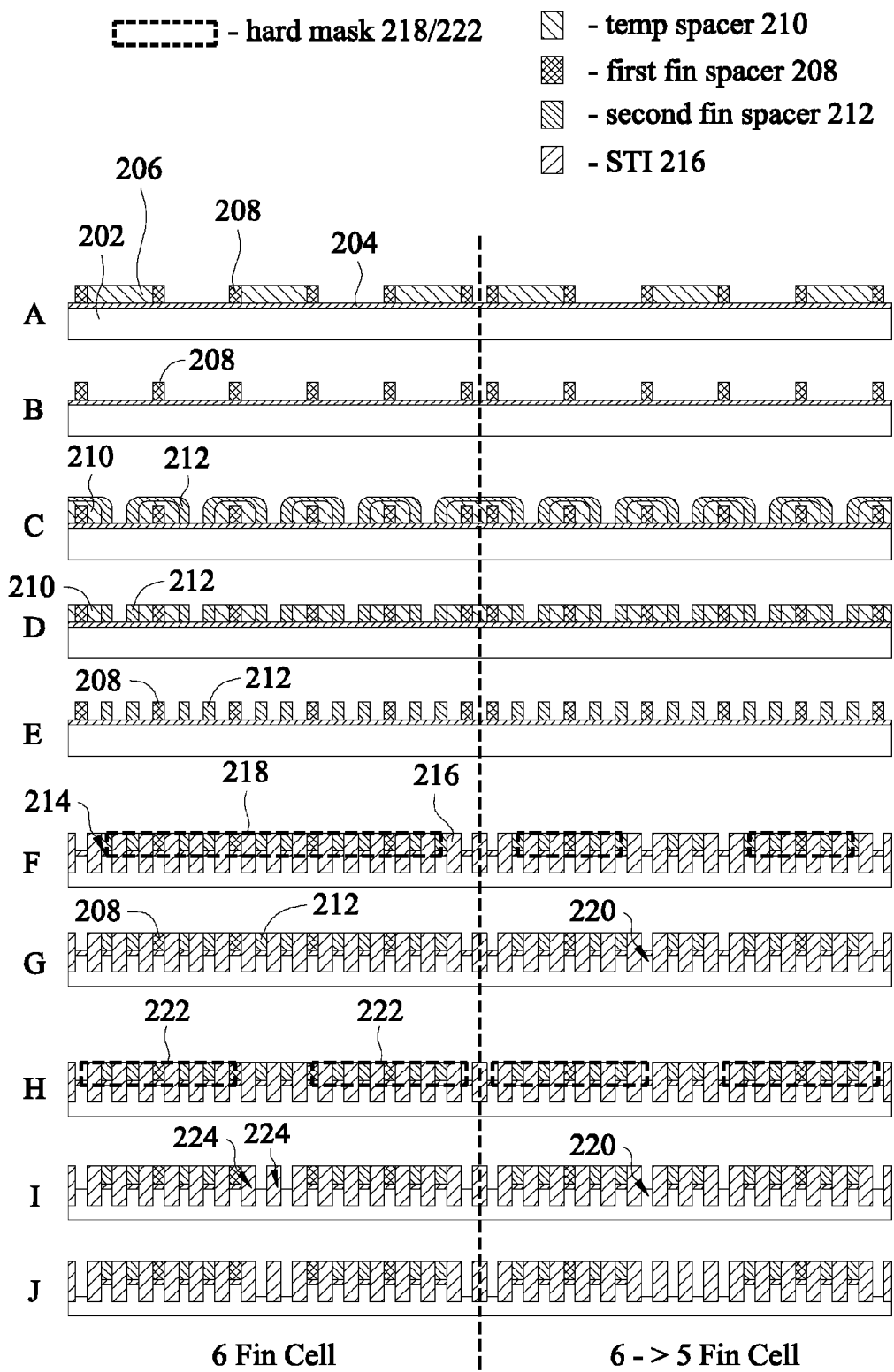
FIGS. 15, 16 and 17 each contain a series of block diagrams, in rows A through J, of additional example semiconductor structures, wherein each row illustrates the example semiconductor structures at a different stage in an example fin fabrication process, in accordance with some embodiments.
Figure 16:
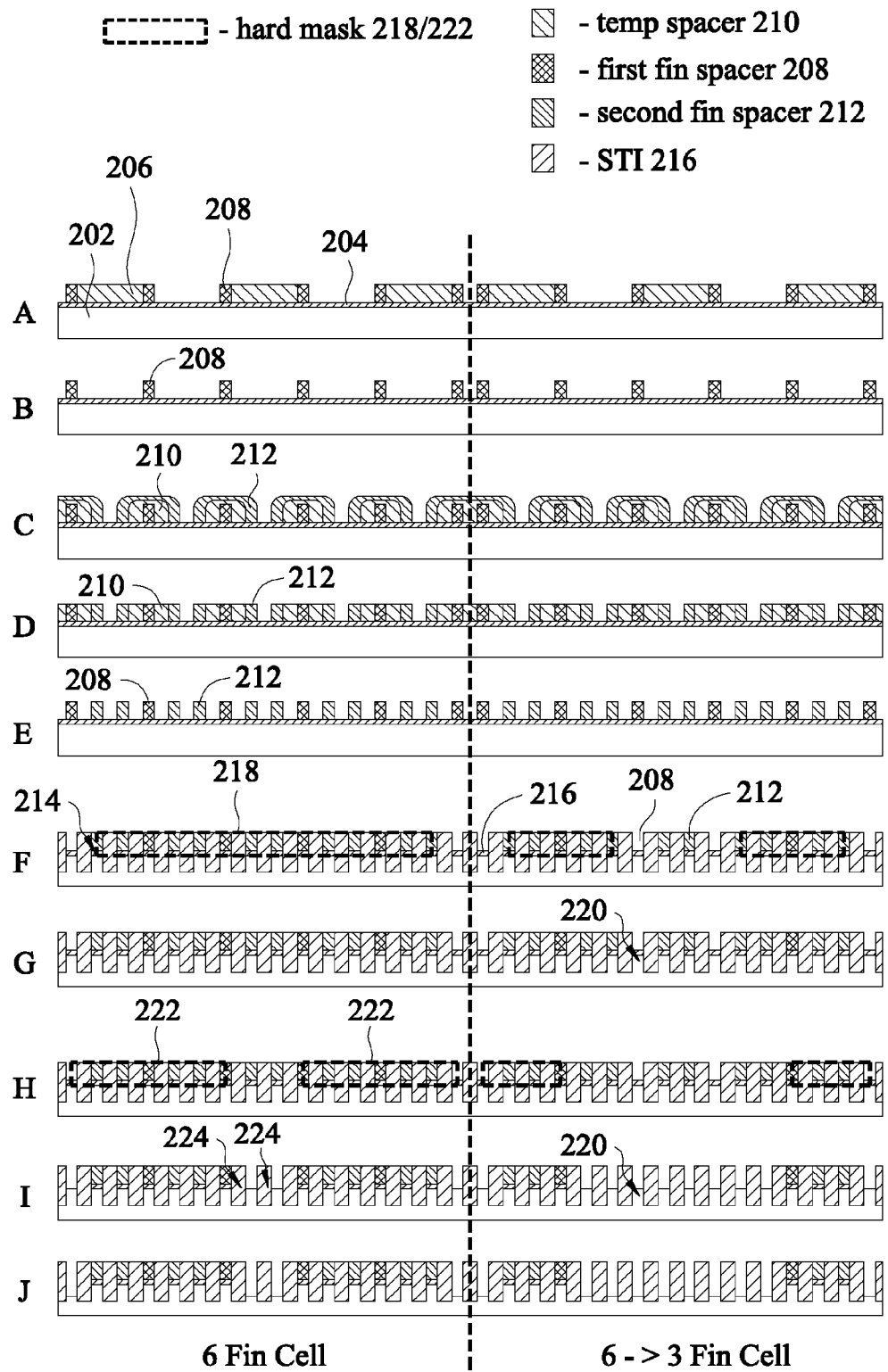
Figure 17:
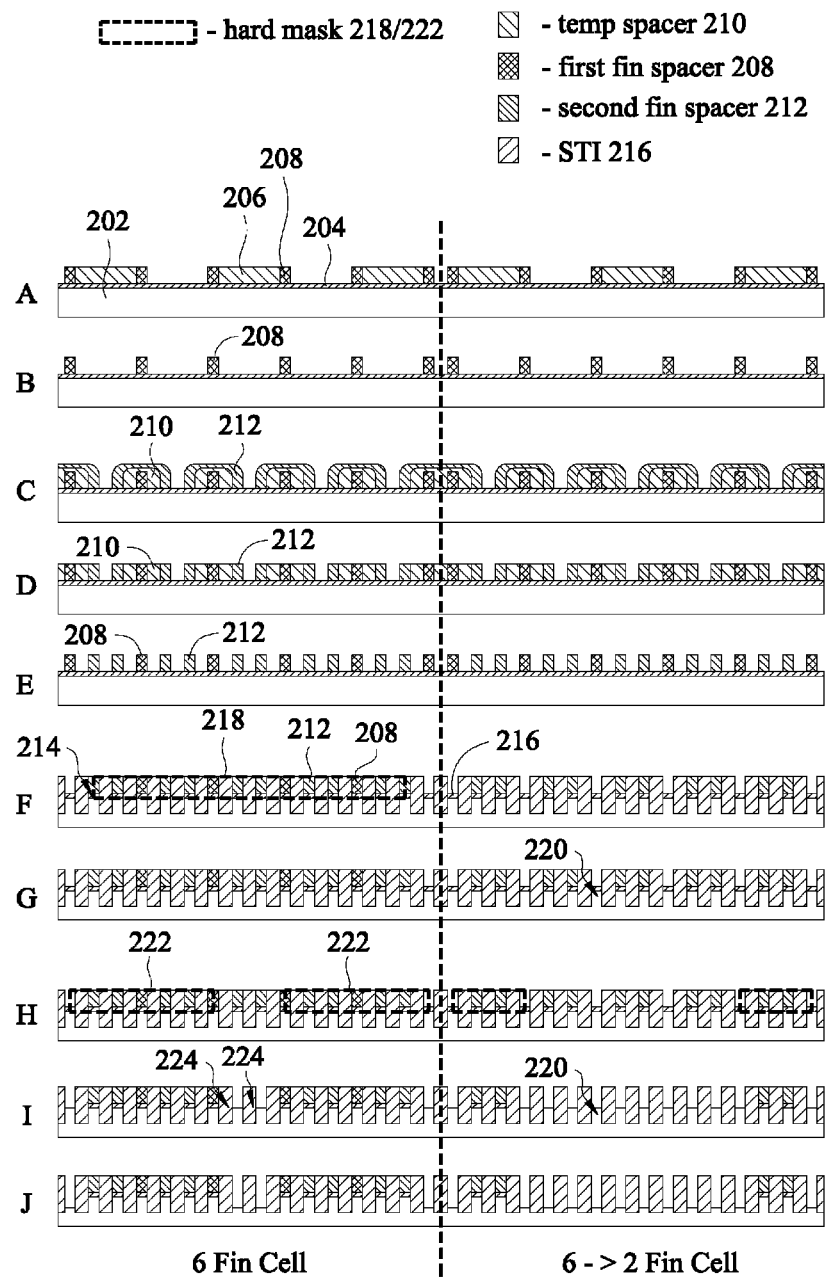

FIGS. 15, 16 and 17 each contain a series of block diagrams, in rows A through J, of additional example semiconductor structures, wherein each row illustrates the example semiconductor structures at a different stage in an example fin fabrication process such as one performed in accordance with the operations specified in FIGS. 1, 2 and 7, and 14. In particular, rows A through E illustrate the depositing of first fin spacers and second fin spacers on a substrate having a hard mask above the substrate's semiconductor material, row F illustrates the forming of global fins under the first and second fin spacers, and rows G through J illustrate the strategic use of the first and second fin spacer material and hard masks in the selective removal of dummy or undesired fins to achieve the fins per transistor ratio desired for different cells on the substrate. The first fin spacers and second fin spacers are strategically placed to allow for the dummy or undesired fins to be selectively removed from the cells while decreasing the risk that desired fins will suffer from fin defects during the fin removal process. In these examples, the first fin spacers and second fin spacers are strategically placed to allow for the simultaneous fabrication of 6 fin cells (FIGS. 15, 16 and 17), 5 fin cells (FIG. 15), 3 fin cells (FIG. 16), and 2 fin cells (FIG. 17).

Row A illustrates an example fabrication stage resulting after performance of operation 132 of FIG. 7 and depicts a substrate 202 with a hard mask (used to protect the substrate) 204 above the substrate and mandrels 206 and first fin spacers 208 deposited above the hard mask. Row B illustrates an example fabrication stage resulting after performance of operation 134 of FIG. 7 and depicts the semiconductor structure after the mandrels have been removed leaving first fin spacers 208. Row C illustrates an example fabrication stage after temporary spacers 210 have been deposited and then second fin spacers 212 have been deposited. Row D illustrates an example fabrication stage resulting after performance of operation 148 of FIG. 7 and depicts that temporary spacers 210 and second fin spacers 212 have been deposited and etched. Row E illustrates an example fabrication stage resulting after performance of operation 150 of FIG. 7 and depicts that temporary spacers 210 have been removed leaving selectively places first and second fin spacers 208, 212.

After the first and second fin spacers have been selectively placed, the fin formation can be accomplished using the techniques described with regard to FIGS. 1 and 2 and rows F-J of FIG. 14. Row F illustrates an example fabrication stage resulting after performance of operation 104 of FIGS. 1, 2, 7 and 9 (and operations 112 and 114 of FIG. 2) and depicts that global fins 214 have been formed under the first fin spacers 208 and second fin spacers 212, the area between the fins have been filled with shallow trench isolation 216, and a first hard mask layer 218 has been applied above some of the fins 214. Row G illustrates an example fabrication stage resulting after performance of operation 106 of FIGS. 1, 2, 7 and 14 (and operations 116, 118 and 120 of FIG. 2) and depicts that the first fin spacer material has been removed above selective fins 220 (e.g., dummy first fins) not protected by the first hard mask layer 218 and that the first hard mask layer has been removed. Row H illustrates an example fabrication stage resulting after performance of operation 122 of FIG. 2 and depicts that a second protective mask layer 222 has been applied above select fins exposing non desired (i.e., dummy) fins. Row I illustrates an example fabrication stage resulting after performance of operation 108 of FIGS. 1, 2, 7 and 14 (and operations 122, 124, and 126 of FIG. 2) and depicts that the second fin spacer material has been removed above selective fins 224 (e.g., dummy second fins) not protected by the second hard mask layer 218, that the second hard mask layer 222 has been removed, and the hard mask has been removed above all dummy fins. Row J illustrates an example fabrication stage resulting after performance of operation 110 of FIGS. 1, 2, 7 and 14 (and operations 128 and 130 of FIG. 2) and depicts that the dummy first and second fins 220, 224 have been removed.

These examples illustrate the simultaneous fabrication of fins in 2 cells but can be applied to the simultaneous fabrication of much more than 2 cells. Also, these examples illustrate that 6 fin cells, 5 fin cells, 3 fin cells, and 2 fin cells may be fabricated simultaneously in a semiconductor device using the example operations described above. By the selective application of the second hard mask layer 218, 6 fin cells (as illustrated in FIGS. 15, 16 and 17), 5 fin cells (as illustrated in FIG. 15), and 3 fin cells (as illustrated in FIG. 16), and 2 fin cells (as illustrated in FIG. 17) may be formed simultaneously.

Described herein are example methods for the simultaneous fabrication of fins in multiple cells having different fin counts. The example methods use a high fin cut overlap control spacer process to achieve better header area and variable fin transition. The example methods can use cut fin last and global fin manufacture operations. The example methods can take up less chip area for cells abutment.

In one embodiment, disclosed is a method of forming fins on a substrate. The method comprises depositing first fin spacers and second fin spacers on a plurality of locations on a substrate, forming fins on the substrate under the first fin spacers and the second fin spacers, removing a plurality of the first fin spacers over dummy first fins without removing any of the second fin spacers, removing a plurality of second fin spacers over dummy second fins without removing any of the first fin spacers, and removing the dummy first fins and the dummy second fins without damaging the fins that remain.

In another embodiment, disclosed is a method of forming fins on a substrate. The method comprises depositing first fin spacers comprising first fin spacer material and second fin spacers comprising second fin spacer material on a plurality of locations on a substrate having a hard mask above the substrate's semiconductor material, wherein the first fin spacers comprise desired first fin spacers and dummy first fin spacers and the second fin spacers comprise desired second fin spacers and dummy second fin spacers. The method further comprises forming fins on the substrate under the first fin spacers and the second fin spacers. The fins comprise a plurality of dummy fins and a plurality of desired fins. The dummy fins comprise a plurality of dummy first fins formed under the dummy first fin spacers and a plurality of dummy second fins formed under the dummy second fin spacers. The method further comprises removing the dummy first fin spacers separately from removing the dummy second fin spacers, removing the dummy second fin spacers, and removing the dummy fins without damaging the desired fins.

These aspects and other embodiments may include one or more of the following features. Removing the dummy first fin spacers may comprise applying a first protective mask layer above the desired first fin spacers and the second fin spacers, wherein second fin spacers are closer to edges of the first protective mask layer than any of the desired first fin spacers; removing the first fin spacer material from the dummy first fins using patterning operations; and removing the first protective mask layer. Removing the dummy second fin spacers may comprise applying a second protective mask layer above the desired first fin spacers and the desired second fin spacers, wherein desired first fin spacers are closer to edges of the second protective mask layer than any of the desired second fin spacers; removing the second fin spacer material from the dummy second fins using patterning operations; and removing the second protective mask layer. Removing the dummy fins without damaging the desired fins may comprise removing the hard mask over the dummy fins and removing the dummy fins using etching operations. Forming fins on the substrate under the first fin spacers and the second fin spacers may comprise removing substrate and the hard mask not under the first fin spacers or second fin spacers using etching operations to form the fins and filling the area between the formed fins with shallow trench isolation (STI) material.

Depositing first fin spacers comprising first fin spacer material and second fin spacers comprising second fin spacer material on a plurality of locations on a substrate having a hard mask above the substrate's semiconductor material may comprise depositing a mandrel and first fin spacers on the hard mask, removing the mandrel after the first fin spacers have been deposited, depositing temporary spacers and second fin spacers on the hard mask, forming the temporary spacers and the second fin spacers into a desired shape using patterning operations, removing the temporary spacers, and trimming the second fin spacers. Depositing first fin spacers comprising first fin spacer material and second fin spacers comprising second fin spacer material on a plurality of locations on a substrate having a hard mask above the substrate's semiconductor material may comprise depositing a mandrel and first fin spacers on the hard mask, removing the mandrel after the first fin spacers have been deposited, depositing first temporary spacers and second fin spacers on the hard mask, forming the first temporary spacers and the second fin spacers into a desired shape using etching operations, depositing second temporary spacers and additional first fin spacers, removing the first temporary spacers and the second temporary spacers. Depositing first fin spacers comprising first fin spacer material and second fin spacers comprising second fin spacer material on a plurality of locations on a substrate having a hard mask above the substrate's semiconductor material may comprise depositing a mandrel and first fin spacers on the hard mask, removing the mandrel after the first fin spacers have been deposited, depositing temporary spacers and second fin spacers on the hard mask, forming the temporary spacers and second fin spacers into a desired shape using etching operations, and removing the temporary spacers.

Removing the dummy fins may comprise simultaneously removing the dummy fins in a first cell on the substrate and in a second cell on the substrate. Simultaneously removing the dummy fins in a first cell and in a second cell may comprise retaining a first number of fins per transistor in the first cell and retaining a second number of fins per transistor in the second cell, wherein the first number and the second number are different. The method may optionally include removing the dummy fins in a third cell when removing the dummy fins in the first cell and the second cell to retain a third number of fins per transistor in the third cell wherein the third number is different from the first and second numbers.

In another embodiment, disclosed is a method of forming fins on a substrate. The method comprises depositing first fin spacers comprising first fin spacer material and second fin spacers comprising second fin spacer material on a plurality of locations on a substrate having a hard mask above the substrate's semiconductor material. The first fin spacers comprise desired first fin spacers and dummy first fin spacers. The second fin spacers comprise desired second fin spacers and dummy second fin spacers. The method further comprises forming fins on the substrate under the first fin spacers and the second fin spacers wherein the fins comprise a plurality of dummy fins and a plurality of desired fins and the dummy fins comprise a plurality of dummy first fins formed under the dummy first fin spacers and a plurality of dummy second fins formed under the dummy second fin spacers. The method further comprises removing the dummy first fin spacers without removing the dummy second fin spacers, removing the dummy second fin spacers, and simultaneously removing the dummy fins in a first cell on the substrate to retain a first number of fins per transistor in the first cell and in a second cell on the substrate to retain a second number of fins per transistor in the second cell without damaging the desired fins. The first number and the second number are different.

These aspects and other embodiments may include one or more of the following features. The method may further comprise simultaneously removing the dummy fins in a third cell when removing the dummy fins in the first cell and the second cell to retain a third number of fins per transistor in the third cell wherein the third number is different from the first and second numbers.

Removing the dummy first fin spacers may comprise applying a first protective mask layer above the desired first fin spacers and the second fin spacers, wherein second fin spacers are closer to edges of the first protective mask layer than any of the desired first fin spacers; removing the first fin spacer material from the dummy first fins using patterning operations; and removing the first protective mask layer. Removing the dummy second fin spacers may comprise applying a second protective mask layer above the desired first fin spacers and the desired second fin spacers, wherein desired first fin spacers are closer to edges of the second protective mask layer than any of the desired second fin spacers; removing the second fin spacer material from the dummy second fins using patterning operations; and removing the second protective mask layer. Removing the dummy fins without damaging the desired fins may comprise removing the hard mask over the dummy fins and removing the dummy fins using etching operations. Forming fins on the substrate under the first fin spacers and the second fin spacers may comprise removing substrate and a hard mask not under the first fin spacers or second fin spacers using etching operations to form the fins and filling the area between the formed fins with shallow trench isolation (STI) material.

Depositing first fin spacers comprising first fin spacer material and second fin spacers comprising second fin spacer material on a plurality of locations on a substrate having a hard mask above the substrate's semiconductor material may comprise depositing a mandrel and first fin spacers on the hard mask, removing the mandrel after the first fin spacers have been deposited, depositing temporary spacers and second fin spacers on the hard mask, forming the temporary spacers and the second fin spacers into a desired shape using patterning operations, removing the temporary spacers, and trimming the second fin spacers. Depositing first fin spacers comprising first fin spacer material and second fin spacers comprising second fin spacer material on a plurality of locations on a substrate having a hard mask above the substrate's semiconductor material may comprise depositing a mandrel and first fin spacers on the hard mask, removing the mandrel after the first fin spacers have been deposited, depositing first temporary spacers and second fin spacers on the hard mask, forming the first temporary spacers and the second fin spacers into a desired shape using etching operations, depositing second temporary spacers and additional first fin spacers, removing the first temporary spacers and the second temporary spacers. Depositing first fin spacers comprising first fin spacer material and second fin spacers comprising second fin spacer material on a plurality of locations on a substrate having a hard mask above the substrate's semiconductor material may comprise depositing a mandrel and first fin spacers on the hard mask, removing the mandrel after the first fin spacers have been deposited, depositing temporary spacers and second fin spacers on the hard mask, forming the temporary spacers and second fin spacers into a desired shape using etching operations, and removing the temporary spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming fins on a substrate, the method comprising:
    depositing first fin spacers and second fin spacers on a plurality of locations on a substrate;
    forming fins on the substrate under the first fin spacers and the second fin spacers;
    removing a plurality of the first fin spacers over dummy first fins without removing any of the second fin spacers;
    removing a plurality of second fin spacers over dummy second fins without removing any of the first fin spacers; and
    removing the dummy first fins and the dummy second fins without damaging the fins that remain.

2. The method of claim 1, wherein forming fins on the substrate under the first fin spacers and the second fin spacers comprises:
    removing substrate and the hard mask not under the first fin spacers or second fin spacers using etching operations to form the fins; and
    filling the area between the formed fins with shallow trench isolation (STI) material.

3. The method of claim 1, wherein depositing first fin spacers comprising first fin spacer material and second fin spacers comprising second fin spacer material on a plurality of locations on a substrate having a hard mask above the substrate's semiconductor material comprises:
    depositing a mandrel and first fin spacers on the hard mask;
    removing the mandrel after the first fin spacers have been deposited;
    depositing temporary spacers and second fin spacers on the hard mask;
    forming the temporary spacers and the second fin spacers into a desired shape using patterning operations;
    removing the temporary spacers;
    trimming the second fin spacers.

4. The method of claim 1, wherein depositing first fin spacers comprising first fin spacer material and second fin spacers comprising second fin spacer material on a plurality of locations on a substrate having a hard mask above the substrate's semiconductor material comprises:
    depositing a mandrel and first fin spacers on the hard mask;
    removing the mandrel after the first fin spacers have been deposited;
    depositing first temporary spacers and second fin spacers on the hard mask;
    forming the first temporary spacers and the second fin spacers into a desired shape using etching operations;
    depositing second temporary spacers and additional first fin spacers;
    removing the first temporary spacers and the second temporary spacers.

5. The method of claim 1, wherein depositing first fin spacers comprising first fin spacer material and second fin spacers comprising second fin spacer material on a plurality of locations on a substrate having a hard mask above the substrate's semiconductor material comprises:
    depositing a mandrel and first fin spacers on the hard mask;
    removing the mandrel after the first fin spacers have been deposited;
    depositing temporary spacers and second fin spacers on the hard mask;
    forming the temporary spacers and second fin spacers into a desired shape using etching operations;
    removing the temporary spacers.

6. A method of forming fins on a substrate, the method comprising:
    depositing first fin spacers comprising first fin spacer material and second fin spacers comprising second fin spacer material on a plurality of locations on a substrate having a hard mask above the substrate's semiconductor material, the first fin spacers comprising desired first fin spacers and dummy first fin spacers, the second fin spacers comprising desired second fin spacers and dummy second fin spacers;
    forming fins on the substrate under the first fin spacers and the second fin spacers, the fins comprising a plurality of dummy fins and a plurality of desired fins, the dummy fins comprising a plurality of dummy first fins formed under the dummy first fin spacers and a plurality of dummy second fins formed under the dummy second fin spacers;
    removing the dummy first fin spacers separately from removing the dummy second fin spacers;
    removing the dummy second fin spacers; and
    removing the dummy fins without damaging the desired fins.

7. The method of claim 6, wherein removing the dummy first fin spacers comprises:
    applying a first protective mask layer above the desired first fin spacers and the second fin spacers, wherein second fin spacers are closer to edges of the first protective mask layer than any of the desired first fin spacers;
    removing the first fin spacer material from the dummy first fins using patterning operations; and
    removing the first protective mask layer.

8. The method of claim 7, wherein removing the dummy second fin spacers comprises:
    applying a second protective mask layer above the desired first fin spacers and the desired second fin spacers, wherein desired first fin spacers are closer to edges of the second protective mask layer than any of the desired second fin spacers;
    removing the second fin spacer material from the dummy second fins using patterning operations; and
    removing the second protective mask layer.

9. The method of claim 8, wherein removing the dummy fins without damaging the desired fins comprises:
    removing the hard mask over the dummy fins; and
    removing the dummy fins using etching operations.

10. The method of claim 6, wherein forming fins on the substrate under the first fin spacers and the second fin spacers comprises:
    removing substrate and the hard mask not under the first fin spacers or second fin spacers using etching operations to form the fins; and
    filling the area between the formed fins with shallow trench isolation (STI) material.

11. The method of claim 6, wherein depositing first fin spacers comprising first fin spacer material and second fin spacers comprising second fin spacer material on a plurality of locations on a substrate having a hard mask above the substrate's semiconductor material comprises:
    depositing a mandrel and first fin spacers on the hard mask;
    removing the mandrel after the first fin spacers have been deposited;
    depositing temporary spacers and second fin spacers on the hard mask;
    forming the temporary spacers and the second fin spacers into a desired shape using patterning operations;
    removing the temporary spacers;
    trimming the second fin spacers.

12. The method of claim 6, wherein depositing first fin spacers comprising first fin spacer material and second fin spacers comprising second fin spacer material on a plurality of locations on a substrate having a hard mask above the substrate's semiconductor material comprises:
    depositing a mandrel and first fin spacers on the hard mask;
    removing the mandrel after the first fin spacers have been deposited;
    depositing first temporary spacers and second fin spacers on the hard mask;
    forming the first temporary spacers and the second fin spacers into a desired shape using etching operations;
    depositing second temporary spacers and additional first fin spacers;
    removing the first temporary spacers and the second temporary spacers.

13. The method of claim 6, wherein depositing first fin spacers comprising first fin spacer material and second fin spacers comprising second fin spacer material on a plurality of locations on a substrate having a hard mask above the substrate's semiconductor material comprises:
    depositing a mandrel and first fin spacers on the hard mask;
    removing the mandrel after the first fin spacers have been deposited;
    depositing temporary spacers and second fin spacers on the hard mask;
    forming the temporary spacers and second fin spacers into a desired shape using etching operations;
    removing the temporary spacers.

14. The method of claim 6, wherein removing the dummy fins comprises simultaneously removing the dummy fins in a first cell on the substrate and in a second cell on the substrate to retain a second number of fins per transistor in the second cell, wherein the first number and the second number are different.

15. The method of claim 14, further comprising simultaneously removing the dummy fins in a third cell when removing the dummy fins in the first cell and the second cell to retain a third number of fins per transistor in the third cell wherein the third number is different from the first and second numbers.

16. A method of forming fins on a substrate, the method comprising:
    depositing first fin spacers comprising first fin spacer material and second fin spacers comprising second fin spacer material on a plurality of locations on a substrate having a hard mask above the substrate's semiconductor material, the first fin spacers comprising desired first fin spacers and dummy first fin spacers, the second fin spacers comprising desired second fin spacers and dummy second fin spacers;
    forming fins on the substrate under the first fin spacers and the second fin spacers, the fins comprising a plurality of dummy fins and a plurality of desired fins, the dummy fins comprising a plurality of dummy first fins formed under the dummy first fin spacers and a plurality of dummy second fins formed under the dummy second fin spacers;
    removing the dummy first fin spacers without removing the dummy second fin spacers;
    removing the dummy second fin spacers; and
    simultaneously removing the dummy fins in a first cell on the substrate to retain a first number of fins per transistor in the first cell and in a second cell on the substrate to retain a second number of fins per transistor in the second cell without damaging the desired fins, wherein the first number and the second number are different.

17. The method of claim 16, further comprising simultaneously removing the dummy fins in a third cell when removing the dummy fins in the first cell and the second cell to retain a third number of fins per transistor in the third cell wherein the third number is different from the first and second numbers.

18. The method of claim 16, wherein removing the dummy first fin spacers comprises:
    applying a first protective mask layer above the desired first fin spacers and the second fin spacers, wherein second fin spacers are closer to edges of the first protective mask layer than any of the desired first fin spacers;
    removing the first fin spacer material from the dummy first fins using patterning operations; and
    removing the first protective mask layer.

19. The method of claim 18, wherein removing the dummy second fin spacers comprises:
    applying a second protective mask layer above the desired first fin spacers and the desired second fin spacers, wherein desired first fin spacers are closer to edges of the second protective mask layer than any of the desired second fin spacers;
    removing the second fin spacer material from the dummy second fins using patterning operations; and
    removing the second protective mask layer.

20. The method of claim 19, wherein simultaneously removing the dummy fins in a first cell and in a second cell comprises:
    removing the hard mask over the dummy fins; and
    removing the dummy fins using etching operations.

* * * * *